United States Patent [19]

Sutton, Jr.

[11] Patent Number: 4,742,153

[45] Date of Patent: May 3, 1988

[54] PROCESS FOR PREPARING POLYIMIDES

[75] Inventor: Richard F. Sutton, Jr., Circleville, Ohio

[73] Assignee: E. I. Du Pont de Nemours and Company, Wilmington, Del.

[21] Appl. No.: 852,688

[22] Filed: Apr. 16, 1986

[51] Int. Cl.$^4$ ............................................. C08G 69/26
[52] U.S. Cl. ................................... 528/353; 528/125; 528/126; 528/128
[58] Field of Search ............... 528/353, 125, 126, 128, 528/352

[56] References Cited

U.S. PATENT DOCUMENTS 3,179,630  4/1965  Endrey ................................ 528/125
4,405,770  9/1983  Schoenberg et al. ............... 528/353

*Primary Examiner*—Morton Foelak
*Assistant Examiner*—M. L. Moore

[57] ABSTRACT

An improved process for preparing polyimides is disclosed which involves end capping intermediate polyamic acids with dicarboxylic acid monoanhydrides and thermally converting to high molecular weight polyimides.

9 Claims, No Drawings

PROCESS FOR PREPARING POLYIMIDES

This invention relates to an improved process for preparing polyimides. More specifically, it relates to a process in which intermediate polyamic acids, in which a portion of the amine groups are end capped with dicarboxylic monoanhydrides, are converted to high molecular weight polyimides.

Polyimides have excellent acceptance in demanding applications such as aerospace, traction motors and flexible printed circuitry because of their unique combination of excellent physical, electrical and chemical properties. Polyimide articles, such as films, are usually manufactured in a two-stage process. The first stage is a polycondensation reaction between a dianhydride and diamine in a suitable solvent. The resulting polyamic acid solution is then fabricated into a shaped article, e.g., a film, by solvent casting and removal of the solvent. In the second stage, the polyamic acid film is either converted chemically or thermally to the polyimide by removal of two molecules of water. It is desirable to use high solids polyamic acid solutions in this process to save on solvent and production costs. It is also necessary to use high molecular weight polyamic acids to obtain the best properties of the final polyimide shaped article. A phenomenon long associated with making and using high solids, high molecular weight polyamic acids, however, has been that the final polymer solutions are extremely viscous. Consequently, it is very difficult to pump these solutions and fabricate them into shaped articles.

SUMMARY OF THE INVENTION

A new process has now been found for making high molecular weight (e.g., inherent viscosity (0.5% in $H_2SO_4$ at 30° C.) of greater than about 0.9 dl/g) polyimides from a low viscosity, high solids solution of polyamic acid by carboxylating or "end-capping" amino groups of the polyamic acid with dicarboxylated monoanhydrides. More specifically, this invention involves forming a solution of an end-capped polyamic acid by contacting, in a suitable solvent, X moles of diamine, Y moles of dicarboxylated monoanhydride and Z moles of dianhydride in such proportions that (i) $Z<X$ and (ii) $Y<$ about $2(X-Z)$. These end-capped polyamic acids are then thermally converted to high molecular weight polyimides by heating them to a temperature above about 50° C. for a time sufficient to form a solid polyimide. Thermal conversion is completed by heating the partially converted polyamic acid to a temperature of a least about 220° C. At this high temperature, the carboxylic acid groups of the dicarboxylic monoanhydrides convert to anhydride functions capable of coupling with free amino groups of the polyamic acid. This "chain extension" leads to high molecular weight polyimides.

The novelty of this invention resides in the preparation and use of an "end-capped" polyamic acid intermediate solution and the finding that the carboxyl groups of such end-capped polyamic acids convert to anhydride functions which react with the amine groups of the diamine at elevated temperatures. The end-capping is accomplished by reacting a certain proportion of the amine groups in the diamine with dicarboxylated monoanhydride, as described in more detail below. By virtue of this end-capping, the molecular weight of the polyamic acid is kept temporarily at a lower level than normal. After forming the polyimide and drying it, its molecular weight builds up in a final, high temperature curing operation to give a polymer with properties equivalent to those for a polymer made from a non-end-capped control polyamic acid intermediate.

An advantage of this new process is that it allows one to prepare processable high solids polyamic acids, i.e., polyamic acid solutions having lower viscosity than solutions prepared from non-end-capped diamines and having substantially the same solids contents or polyamic acid solutions having substantially the same viscosity as polyamic acid solutions prepared from non-end-capped diamines but also having higher solids contents. This allows for substantial savings in manufacturing and solvent cost, no small matter when expensive solvents such as dimethyl acetamide are used.

DETAILED DESCRIPTION

The polyamic acid solution intermediates of this invention can be made generally as disclosed in U.S. Pat. Nos. 3,179,630 and 3,179,634, the disclosures of which are hereby incorporated by reference. The dianhydride, carboxylated monoanhydride and diamine are dissolved together in a suitable solvent, and the resulting solution is agitated under controlled temperature conditions until polymerization of the dianhydride and the diamine is completed. The order of addition of the reactants is not critical, i.e., the monoanhydride can be added to the amine before, with or after addition of the dianhydride. The amount of solvent can be controlled so that the resulting polyamic solutions are viscous enough to be extruded or cast into shaped articles such as films and fibers.

Suitable diamines include those of the formula $H_2N-R-NH_2$ where R is a divalent benzenoid radical selected from the group consisting of

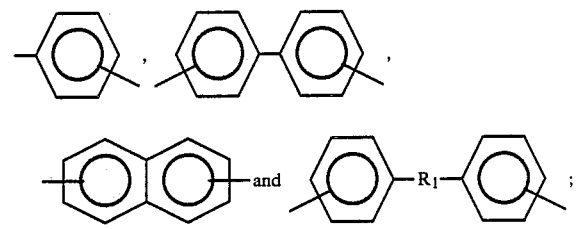

$R_1$ is selected from the group consisting of optionally substituted (e.g., with halogen, alkyl or haloalkyl) alkylene chain having 1 to 3 carbon atoms, an aryl group, $-O-$, $-S-$, $-SO_2-$,

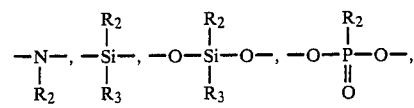

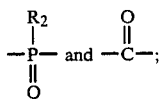

$R_2$ and $R_3$ are selected from the group consisting of alkyl and aryl. A few of the diamines suitable for use in polyimide manufacture of the present invention include: p-phenylene diamine, 4,4'-diaminodiphenyl propane; 4,4'-diaminodiphenyl methane; benzidine, 3,3'-dichlorobenzidine; 4,4'-diaminodiphenyl sulfide; 3,3'- diaminodiphenyl sulfone; 4,4'-diaminodiphenyl sulfone; 4,4'-diaminodiphenyl ether (oxydianiline); 1,5-diamino naphthalene; 4,4'-diaminodiphenyl diethylsilane; 4,4'-diaminodiphenyl diphenylsilane; 4,4'-diamino diphenyl ethyl phosphine oxide; 4,4'-diaminodiphenyl N-methyl amine; 4,4'-diaminodiphenyl N-phenyl amine; and the like.

Suitable dianhydrides include those of the formula

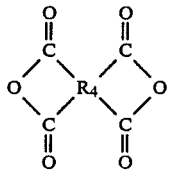

where $R_4$ is a tetravalent aromatic organic radical, the four carboxyl groups being attached to separate carbon atoms in a ring and carbon atoms of each pair of carbonyl groups being attached to adjacent carbon atoms in a ring of the radical. A few of the dianhydrides suitable for use in polyimide manufacture of the present invention include: pyromellitic dianhydride; 2,3,6,7-naphthalene tetracarboxylic dianhydride; 3,3',4,4'-diphenyl tetracarboxylic dianhydride; 1,2,5,6-naphthalene tetracarboxylic dianhydride; 2,2',3,3'-diphenyl tetracarboxylic dianhydride; 3,3',4,4'-benzophenone tetracarboxylic dianhydride; 2,2-bis(3,4-dicarboxyphenyl)-propane dianhydride; bis(3,4-dicarboxyphenyl)sulfone dianhydride; 3,4,9,10-perylene tetracarboxylic dianhydride; bis(3,4-dicarboxyphenyl)propane dianhydride; 1,1-bis(2,3-dicarboxyphenyl)ethane dianhydride; 1,1-bis(3,4-dicarboxyphenyl)ethane dianhydride; bis(2,3-dicarboxyphenyl)methane dianhydride; bis(3,4-dicarboxyphenyl)methane dianhydride; bis(3,4-dicarboxyphenyl)sulfone dianhydride; and the like. Suitable monoanhydrides are those corresponding to the dianhydrides listed above.

Although copolyimides derived from any of the above diamines and dianhydrides are operable, the preferred polyimide of this invention is derived from 4,4'-diaminophenyl ether, pyromellitic dianhydride and pyromellitic monoanhydride.

Solvents suitable for use in this invention are dipolar aprotic solvents such as those of the N,N-dialkylcarboxylamide class. Preferred solvents include the lower molecular weight members of such carboxylamides, particularly, N,N-dimethylformamide and N,N-dimethylacetamide. Other useful compounds of this class of solvents are N,N-diethylformamide and N,N-diethylacetamide. Other solvents which may be used in the present invention are dimethylsulfoxide, N-methyl-2-pyrrolidone, tetramethyl urea, dimethylsulfone, hexamethylphosphoramide, tetramethylene sulfone, and the like. The solvents can be used alone, in combinations of solvents, or in combinations with poor solvents such as benzene, benzonitrile, dioxane, etc.

The stoichiometry of the reactants is important. The number of amine ends in the intermediate polyamic acid must be greater than zero for the chain extension to occur since the carboxyl end groups react with amine end groups. Thus, the moles of dianhydride (Z) plus one half the moles of monoanhydride ($\frac{1}{2}$ Y) must be less than the moles of diamine (X). Preferably, the mole ratio of dianhydride plus monoanhydride to diamine is close to 1:1. The maximum number of moles of monoanhydride is about twice the difference between the number of moles diamine and the number of moles dianhydride. Preferably, the amount of monoanhydride compound is between about 0.4 to 2.0 mole % of the diamine.

As previously indicated, the end-capped polyamic acid solutions made as described above differ in several respects from corresponding non-end-capped polyamic acid solutions. First, it is possible to prepare a processable end-capped polyamic solution having up to about 5% higher solids content than corresponding non-end-capped polyamic acids. For non-end-capped polyamic acids, one generally cannot exceed about a 20% solids solution and retain processability (e.g., ability to mix polymer during preparation and pumping). With the end-capped polyamic acids of this invention, one can prepare processable high solids solutions, those high solids solutions being defined as solutions of about 15 to 30% solids, preferably about 20 to 25% solids. These high solids solutions can have viscosities substantially the same as or only slightly higher than lower solids solutions of corresponding non-end-capped polyamic acids. Conversely, solutions of end-capped polyamic acids having the same solids contents as solutions of non-end-capped polyamic acids can be made which, because of their lower viscosity, are easier to process than the non-end-capped solutions. The use of lower viscosity polyamic acid solutions prepared by this invention is advantageous because it makes it easier to level thickness differences in cast films without streaking.

Conversion of the end-capped polyamic acid to polyimide is accomplished by a thermal conversion process. Usually, this is a two-step process, the first step of which involves heating the polyamic acid at a temperature of above about 50° C. to partially convert the polyamic acid to polyimide. The extent of polyamic acid conversion in this first step will depend on the temperature employed and the time of exposure, but, generally about 25 to 95% of amic acid groups are converted to imide groups. The second step involves heating the partially converted polyamic acid to a higher temperature (e.g., at least about 220° C.). At or above about 220° C., conversion of polyamic acid to polyimide is completed and chain extension (occurring as a result of conversion of carboxylic acid groups to anhydride and reaction with free amino groups) occurs. It is believed that chain extension occurs almost immediately at this temperature, so holding the composition at this temperature for as short a period as a second should be sufficient. A preferred thermal conversion process involves raising the temperature of the polyamic acid solution to about 120° to 160° C. in stages (preferably, over a period of about 5 to 60 minutes) followed by heating above 220° C. (preferably, about 300° to 450° C.) for a period up to about one hour.

The process of this invention is further illustrated by the following examples.

EXAMPLE 1

10.0 gm of oxydianiline (ODA) was placed in a 250 cc beaker and dissolved in 50 cc dimethylacetamide (DMAc). A pyromellitic monoanhydride (PMMA) solution was prepared by dissolving 0.1402 gm of pyromellitic dianhydride (PMDA) in a 13.7 cc of dimethylacetamide. Water (0.025 cc) was added to the dianhydride solution to hydrolyze it to monoanhydride. After 20 minutes, the dianhydride was converted to the monoanhydride and was then added to the oxydianiline solution and rinsed in with 5 cc dimethylacetamide before the monoanhydride could change to the tetracarboxylic acid. The solution was stirred for 15 minutes so that the monoanhydride would react with the ODA. Then, 10.27 gm solid PMDA was added and rinsed in with 11.3 cc DMAc and stirred until all was dissolved. A solution of 0.4392 gm PMDA in 7.3 cc DMAc was then added and stirred in for 30 minutes. The resulting polymer had a solids content of 20.3%, a poise of 15 at 25° C., mole PMMA to ODA of 0.0129, mole PMDA to ODA of 0.9831, mole PMMA+mole PMDA to mole ODA of 0.9960, and number average molecular weight of 4750. The polymer solution was cast onto a glass plate with a rod having a 25 mil gap. The plate was placed on a hotplate set at 93° C. and increased to 138° C. setting over 20 minutes. The film was stripped from the glass plate and dried in a frame at 300° C. for 30 minutes in an air oven followed by drying 20 seconds at 405° C. the resulting thermally converted film had an inherent viscosity of 1.42.

EXAMPLE 2

Using the same general procedure as described in Example 1, two polyamic acid solutions were made from oxydianiline (ODA) and pyromellitic dianhydride (PMDA). A control solution contained polymer with no carboxylated monoanhydride; the sample solution contained polymer with carboxylated monoanhydride. The two solutions and their properties are described in Table 1.

TABLE 1

| Polymer | Control | Sample |
| --- | --- | --- |
| % solids in DMAc | 21.2 | 20.2 |
| mole PMMA/mole ODA | 0.000 | 0.026 |
| mole PMDA/mole ODA | 0.995 | 0.974 |
| ½ mole PMMA + PMDA/mole ODA | 0.995 | 1.000 |
| Solution Viscosity | 2600 | 63 |
| Number Ave. Molecular Weight | 15,700 | 11,000 |

As the data in the Table show, the carboxylated polymer solution had a viscosity that was at least an order of magnitude lower than the control solution of about the same solids content. When both polymers were thermally converted to polyimide by a process similar to that in Example 1, films of both polyimides were found to have the same final inherent viscosity (1.23 dl/g), indicating that high molecular weight polyimides were made by both processes even though the carboxylated polymer started with a lower molecular weight.

EXAMPLE 3

This example illustrates that the carboxylated monoanhydride can be added after all PMDA has been added, i.e., that the order of addition of the carboxylated monoanhydride and the dianhydride is not critical.

A control polymer was prepared by dissolving 20.0 gm of oxydianiline (ODA) in 196.0 cc of dimethylacetamide (DMAc). Then, 21.36 gm pyromellitic anhydride (PMDA) were added, rinsed in with 20 cc DMAc, and stirred until all had dissolved. A solution of 0.410 gm of PMDA in 6.428 gm of DMAc was added and stirred until all had reacted. The resulting solution had a solution viscosity of 3854 poise at 25° C. and contained 0.9993 moles PMDA per mole ODA. The polymer solution was cast onto a glass plate with a rod having a 25 mil gap. The plate was placed on a hotplate set at 200° F. and increased to 325° F. over 25 minutes. The film was stripped from the glass plate and dried in a frame at 300° C. for 30 minutes in an air oven followed by drying 30 seconds at 405° C. The resulting thermally converted film has an inherent viscosity of 1.50 dl/gm.

A carboxylated polymer of the same final solids content was prepared in a similar manner by dissolving 20.0 gm ODA in 166.0 cc of DMAc. Then, 21.36 gm PMDA were added, rinsed in with 20 cc DMAc, and stirred until dissolved. A solution of 0.1676 gm PMDA in 2.626 gm DMAc was added to the polymer and stirred in for 30 minutes. A pyromellitic monoanhydride (PMMA) solution was prepared by adding 0.0215 cc of water to a solution of 0.260 gm PMDA in 24.3 cc DMAc and stirring for 20 minutes at 20° C. The PMMA solution was immediately added to the polymer solution and rinsed in with 10 cc DMAc and stirred 10 minutes. The resultant polymer had the same solids content as the control (about 16.6%) but a much lower solution viscosity (220 poise) because the monoanhydride end capped the polymer instead of causing chain extension. The ratio moles of PMDA plus ½ moles PMMA to moles of ODA was 0.9941. This polymer was cast and heated in a manner identical to the control to produce a film with an inherent viscosity of 1.70 dl/gm which was higher than the control made from a much more viscous polymer.

What is claimed is:
1. A process for preparing a polyimide comprising
    (a) forming an intermediate polyamic acid solution by contacting, in a suitable solvent, X moles of diamine, Y moles of dicarboxylated monoanhydride and Z moles of dianhydride in such proportions that (i) Z<X and (ii) y<about 2 (X−2);
    (b) heating said polyamic acid at a temperature above about 50° C. for a time sufficient to form a solid polyimide and sufficient to heat said polyamic acid to a temperature of at least about 220° C.
2. The process of claim 1 where said diamine has the formula

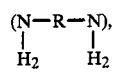

said dianhydride has the formula

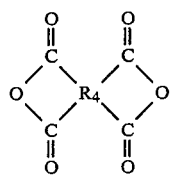

and said dicarboxylated monoanhydride has the formula

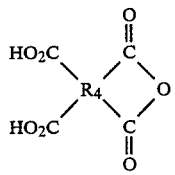

where
    R is a divalent benzenoid radical selected from the group consisting of

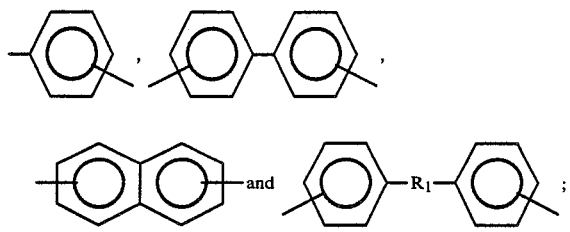

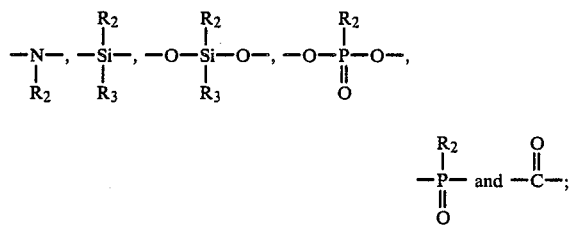

$R_1$ is selected from the group consisting of alkylene chain having 1 to 3 carbon atoms, an aryl group, —O—, —S—, —SO$_2$—, $$-\overset{R_2}{\underset{R_2}{N}}-,\ -\overset{R_2}{\underset{R_3}{Si}}-,\ -O-\overset{R_2}{\underset{R_3}{Si}}-O-,\ -O-\overset{R_2}{\underset{\overset{\|}{O}}{P}}-O-,$$

$$-\overset{R_2}{\underset{\overset{\|}{O}}{P}}-\ \text{and}\ -\overset{O}{\underset{}{\overset{\|}{C}}}-;$$

$R_2$ and $R_3$ are selected from the group consisting of alkyl and aryl; and $R_4$ is a tetravalent aromatic organic radical, the four carboxyl groups being attached to separate carbon atoms in a ring and carbon atoms of each pair of carbonyl groups being attached to adjacent carbon atoms in a ring of the radical wherein said $R_1$ groups may be substituted with halogen, alkyl or haloalkyl.

3. The process of claim 2 where the diamine is 4,4'-diaminodiphenyl ether, the dianhydride is pyromellitic dianhydride and the monoanhydride is pyromellitic monoanhydride.

4. The process of claim 1 where the mole ratio of dianhydride plus monoanhydride to diamine is about 1:1.

5. The process of claim 2 where the mole ratio of dianhydride plus monoanhydride to diamine is about 1:1.

6. The process of claim 1 where amount of monoanhydride is about 0.4 to 2.0 mole % of the diamine.

7. The process of claim 2 where amount of monoanhydride is about 0.4 to 2.0 mole % of the diamine.

8. The process of claim 1 where the polyamic acid is heated in stages to about 120° to 160° C. and then to about 300° to 450° C.

9. The process of claim 2 where the polyamic acid is heated in stages to about 120° to 160° C. and then to about 300° to 450° C.

* * * * *